US012772717B2

(12) United States Patent
Yang et al.

(10) Patent No.: US 12,772,717 B2
(45) Date of Patent: Oct. 20, 2026

(54) DISPLAY PANEL COMPRISING PARTITION COLUMN INCLUDING STACKED AUXILIARY AND SHIELDING PATTERNS

(71) Applicant: Visionox Technology Inc., Suzhou (CN)

(72) Inventors: Bowen Yang, Suzhou (CN); Yiming Xiao, Suzhou (CN); Xuejing Zhu, Suzhou (CN); Yuan Yao, Suzhou (CN); Haohan Zhang, Suzhou (CN); Liusong Ni, Suzhou (CN)

(73) Assignee: Visionox Technology Inc., Suzhou (CN)

( * ) Notice: Subject to any disclaimer, the term of this patent is extended or adjusted under 35 U.S.C. 154(b) by 345 days.

(21) Appl. No.: 18/623,469

(22) Filed: Apr. 1, 2024

(65) Prior Publication Data

US 2024/0251646 A1 Jul. 25, 2024

Related U.S. Application Data

(63) Continuation of application No. PCT/CN2023/111214, filed on Aug. 4, 2023.

(30) Foreign Application Priority Data

Oct. 31, 2022 (CN) ......................... 202211350426.0

(51) Int. Cl.
*H10K 59/80* (2023.01)
*H10K 59/122* (2023.01)

(52) U.S. Cl.
CPC ....... *H10K 59/8792* (2023.02); *H10K 59/122* (2023.02)

(58) Field of Classification Search
CPC ...... H10K 59/12; H10K 59/35; H10K 59/875; H10K 59/122; H10K 59/8792;
(Continued)

(56) References Cited

U.S. PATENT DOCUMENTS 8,680,543 B2 3/2014 Takeda et al.
2012/0217516 A1* 8/2012 Hatano ................ H10K 59/122 257/E33.062

(Continued)

FOREIGN PATENT DOCUMENTS

CN 107919379 A 4/2018
CN 111276520 A 6/2020

(Continued)

OTHER PUBLICATIONS

Office Action issued on Jan. 6, 2025, in corresponding Korean Application No. 10-2024-7017840, 14 pages.

(Continued)

*Primary Examiner* — Didarul A Mazumder
(74) *Attorney, Agent, or Firm* — Maier & Maier, PLLC

(57) ABSTRACT

A display panel and a display apparatus, where the display panel includes: a base plate; a pixel definition layer located on the base plate, the pixel definition layer including at least one isolation portion and a pixel opening enclosed by the isolation portion; at least one light-emitting unit provided in the pixel opening; a light shielding portion located at a side of the isolation portion away from the base plate and extending towards the pixel opening, where an orthographic projection of the light shielding portion on the base plate at least partially overlaps an orthographic projection of the light-emitting unit on the base plate, so that the light shielding portion can shield a surface of a part of the light-emitting units away from the base plate.

18 Claims, 4 Drawing Sheets

(58) Field of Classification Search

CPC ............. H10K 50/86; H10K 59/80522; H10K 59/873; H10K 59/38; H10K 59/131; H10K 59/80521; H10K 59/876; H10K 2102/351; H10D 99/00

USPC ........................................ 257/40; 438/82, 99

See application file for complete search history.

(56) References Cited

U.S. PATENT DOCUMENTS

| | | | | |
|---|---|---|---|---|
| 2014/0203271 | A1* | 7/2014 | Yoneda | H10K 59/35 257/40 |
| 2016/0064691 | A1 | 3/2016 | Lee et al. | |
| 2016/0315125 | A1* | 10/2016 | Kikuchi | G02B 5/201 |
| 2016/0372528 | A1* | 12/2016 | Kamura | H10K 30/87 |
| 2018/0151824 | A1 | 5/2018 | Park et al. | |
| 2021/0119183 | A1 | 4/2021 | Lee et al. | |
| 2022/0190272 | A1* | 6/2022 | Sun | H10K 59/352 |

FOREIGN PATENT DOCUMENTS

| | | | |
|---|---|---|---|
| CN | 113571656 | A | 10/2021 |
| CN | 109638177 | B | 1/2022 |
| CN | 114188492 | A | 3/2022 |
| CN | 114335106 | A | 4/2022 |
| CN | 114361226 | A | 4/2022 |
| CN | 115224219 | A | 10/2022 |
| CN | 115224222 | A | 10/2022 |
| CN | 115224223 | A | 10/2022 |
| CN | 115666161 | A | 1/2023 |
| CN | 219981443 | U | 11/2023 |
| JP | 2012182121 | A | 9/2012 |
| JP | 2012190794 | A | 10/2012 |
| JP | 2013008669 | A | 1/2013 |
| JP | 2016122606 | A | 7/2016 |
| JP | 2019009005 | A | 1/2019 |
| JP | 2021039328 | A | 3/2021 |
| JP | 2021113977 | A | 8/2021 |
| JP | 2022081576 | A | 5/2022 |
| JP | 2022096395 | A | 6/2022 |
| JP | 2022108901 | A | 7/2022 |
| KR | 1020030058155 | A | 7/2003 |
| KR | 20050014437 | A | 2/2005 |
| KR | 1020180061612 | A | 6/2018 |
| KR | 1020190076090 | A | 7/2019 |
| WO | 2020088298 | A1 | 5/2020 |
| WO | 2021085176 | A1 | 5/2021 |
| WO | 2021229553 | A1 | 11/2021 |
| WO | 2022039890 | A1 | 2/2022 |
| WO | 2022050983 | A1 | 3/2022 |
| WO | 2022172981 | A1 | 8/2022 |

OTHER PUBLICATIONS

International Search Report mailed on Nov. 16, 2023, in corresponding International Patent Application No. PCT/CN2023/111214, 6 pages.

Office Action issued on Dec. 23, 2025, in corresponding Chinese Application No. 202211350426.0, 18 pages.

Extended Search Report issued on Dec. 17, 2025, in corresponding European Application No. 25204425.0, 10 pages.

Office Action issued on Jun. 3, 2025, in corresponding Japanese Application No. 2024-533276, 21 pages.

Office Action issued on May 29, 2026, in corresponding Korean Application No. 10-2025-7030397, 24 pages.

Extended Search Report issued on Apr. 30, 2026, in corresponding European Application No. 23884352.8, 9 pages.

* cited by examiner

DISPLAY PANEL COMPRISING PARTITION COLUMN INCLUDING STACKED AUXILIARY AND SHIELDING PATTERNS

CROSS REFERENCE TO RELATED APPLICATION

The present application is a continuation application of International Application No. PCT/CN2023/111214, filed on Aug. 4, 2023, which claims priority to Chinese Patent Application No. 202211350426.0 filed on Monday, Oct. 31, 2022, and titled "DISPLAY PANEL AND DISPLAY APPARATUS", all of which are hereby incorporated by reference in their entireties.

TECHNICAL FIELD

The present application relates to the field of display, and particularly to a display panel and a display apparatus.

BACKGROUND

A flat display panel such as a Liquid Crystal Display (LCD) panel, an Organic Light-emitting Display (OLED) panel, and a display panel using a Light-emitting Diode (LED) device is widely used in various consumer electronic products such as a mobile phone, a TV, a personal digital assistant, a digital camera, a notebook computer, a desktop computer due to the advantages of high image quality, power saving, thin body and wide application range, and becomes the mainstream in a display apparatus.

The OLED panel usually includes a plurality of light-emitting units, and adjacent light-emitting units have a risk of light mixing, which affects the display effect of the display panel.

SUMMARY

Embodiments of the present application provide a display panel and a display apparatus, which is intended to improve the display effect of the display panel.

An embodiment of a first aspect of the present application provides a display panel, including: a base plate; a pixel definition layer located on the base plate, the pixel definition layer including at least one isolation portion and a pixel opening enclosed by the isolation portion; at least one light-emitting unit provided in the pixel opening; a partition column including an auxiliary portion and a light shielding portion stacked in sequence at a side of the isolation portion away from the base plate, where an orthographic projection of the auxiliary portion on the base plate is located within an orthographic projection of the light shielding portion on the base plate.

An embodiment of a second aspect of the present application provides a display apparatus, including the display panel according to any of the implementations.

In the display panel according to the embodiments of the present application, the display panel includes the base plate, the pixel definition layer arranged on the base plate, the auxiliary portion, and the light shielding portion. The pixel definition layer includes at least one isolation portion and a pixel opening enclosed by the isolation portion, and the pixel opening is configured to accommodate at least one light-emitting unit, which is used for implementing light emission or colorized display of the display panel. The partition column includes the auxiliary portion and the light shielding portion arranged in sequence at a side of the isolation portion away from the base plate. By arranging the auxiliary portion, a distance between the light shielding portion and the light-emitting unit can be increased, and the influence of the light shielding portion on the light-emitting unit is reduced. The orthographic projection of the auxiliary portion on the base plate is located within the orthographic projection of the light shielding portion on the base plate, i.e., the light shielding portion has a greater size. Therefore, the light shielding portion can shield great-angle light emitted by at least a part of light-emitting units, the problem that light emitted by the light-emitting unit enters an adjacent light-emitting unit is mitigated, the problem that light from two adjacent light-emitting units easily mixes is further mitigated, and the display effect of the display panel can be improved.

DETAILED DESCRIPTION

Features of various aspects and exemplary embodiments of the present application will be described in detail below. In order to make objects, technical solutions and advantages of the present application clearer, the present application is further described in detail below with reference to the drawings and specific embodiments. It should be understood that the specific embodiments described herein are only configured to explain the present application, but not to limit the present application.

Embodiments of the present application provide a display panel, a display apparatus and a method for manufacturing a display panel, and various embodiments of the display panel and the display apparatus will be described below with reference to the drawings.

An embodiment of the present application provide a display panel, which may be an organic light-emitting diode (OLED) display panel.

Figure 1:
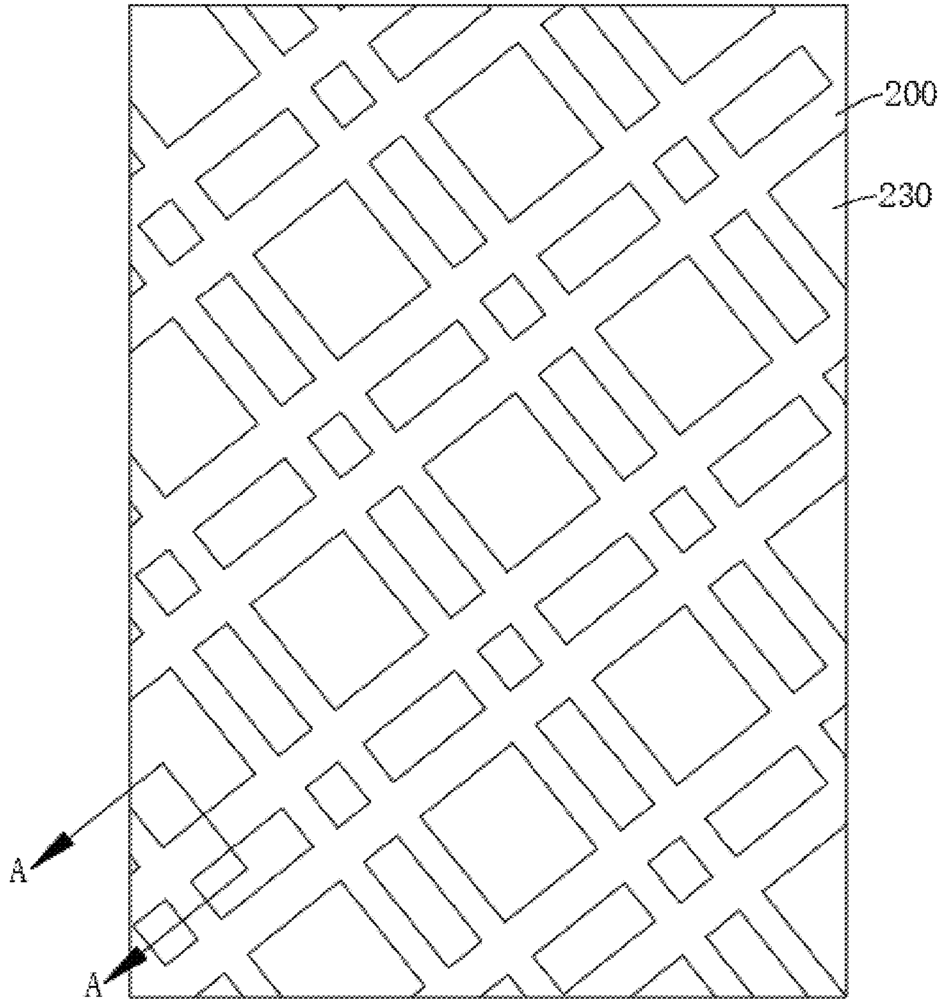
FIG. 1 shows a top schematic diagram of a partial layer structure of a display panel according to an embodiment of the present application.
Figure 2:
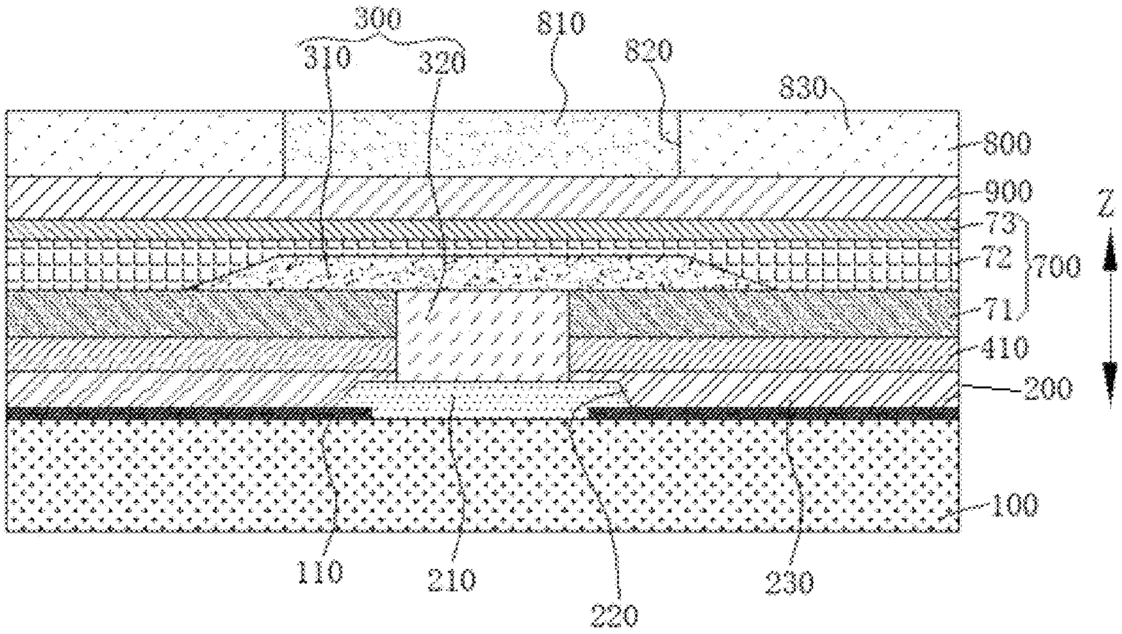
FIG. 2 shows a cross-sectional view at A-A in FIG. 1 in an embodiment.

Referring to FIGS. 1 and 2, FIG. 1 shows a top schematic diagram of a partial layer structure of a display panel according to an embodiment of the present application. FIG. 2 is a cross-sectional view along A-A in FIG. 1.

As shown in FIGS. 1 and 2, the display panel according to an embodiment of the present application includes a base plate 100, a pixel definition layer 200 arranged on the base plate 100, at least one light-emitting unit 230, and a partition column 300. The pixel definition layer 200 is located on the base plate 100, the pixel definition layer 200 includes at least one isolation portion 210 and a pixel opening 220 enclosed by the isolation portion 210, and at least one light-emitting unit 230 is provided in the pixel opening 220. The at least one isolation portion 210 may include a plurality of isolation portions 210, the at least one light-emitting unit 230 may include a plurality of light-emitting units 230. The partition column 300 includes an auxiliary portion 320 and a light shielding portion 310 stacked in sequence at a side of the isolation portion 210 away from the base plate 100, and an orthographic projection of the auxiliary portion 320 on the base plate 100 is located within an orthographic projection of the light shielding portion 310 on the base plate 100.

In the display panel according to the embodiments of the present application, the display panel includes the base plate 100, the pixel definition layer 200 arranged on base plate 100, and the partition column 300. The pixel definition layer 200 includes at least one isolation portion 210 and a pixel opening 220 enclosed by the isolation portion 210, and the pixel opening 220 is configured to accommodate the light-emitting unit 230, which is used for implementing light emission or colorized display of the display panel. The partition column 300 includes the auxiliary portion 320 and the light shielding portion 310 arranged in sequence at a side of the isolation portion 210 away from the base plate 100. By arranging the auxiliary portion 320, a distance between the light shielding portion 310 and the light-emitting unit 230 can be increased, and the influence of the light shielding portion 310 on the light-emitting unit 230 can be reduced. In addition, the orthographic projection of the auxiliary portion 320 on the base plate 100 is located within the orthographic projection of the light shielding portion 310 on the base plate 100, i.e., the light shielding portion 310 has a greater size. Therefore, the light shielding portion 310 can shield great-angle light emitted by at least a part of light-emitting units 230, the problem that light emitted by the light-emitting unit 230 enters an adjacent light-emitting unit 230 is mitigated, the problem that light from two adjacent light-emitting units 230 easily mixes is further mitigated, and the display effect of the display panel can be improved.

Furthermore, a total height of the auxiliary portion 320 and the light shielding portion 310 is increased by arranging the auxiliary portion 320, and at the same time, the size of the light shielding portion 310 is greater than a size of the auxiliary portion 320, so that a carrier layer of the light-emitting unit 230 is more likely to break in the vicinity of the partition column 300 and can break into a plurality of sub-portions, so as to improve the spread of water and oxygen in the carrier layer and increase the yield of the carrier layer.

In some other embodiments, since the carrier layer of the light-emitting unit 230 is generally formed using a full-face evaporation process, lateral conduction may occur between two adjacent light-emitting units 230 due to a full-face evaporated film layer, i.e. carriers may flow between the two adjacent light-emitting units 230, which causes a light-emitting unit 230 that is not required to be display to emit weak light. In the present embodiment, an area of the orthographic projection of the auxiliary portion 320 is less than an area of the orthographic projection of the light shielding portion 310, and at least a part of light shielding portions 310 are arranged in a hanging manner. Therefore, when the light-emitting unit 230 is manufactured after having the light shielding portion 310, the light shielding portion 310 can shield an evaporation material for manufacturing the light-emitting unit 230, so that the carrier layer cracks at the partition column 300, so as to avoid and mitigate the problem that the lateral conduction occurs between the two adjacent light-emitting units 230, and improve the display effect of the display panel.

In some optional embodiments, with further reference to FIG. 2, an area of the orthographic projection of the auxiliary portion 320 on the base plate 100 is less than an area of the orthographic projection of the isolation portion 210 on the base plate 100.

In these optional embodiments, the size of the auxiliary portion 320 is less than a size of the isolation portion 210, so that the auxiliary portion 320 do not shield the pixel opening 220, and a first electrode 410 located between adjacent auxiliary portions 320 can better cover the light-emitting unit 230.

Optionally, a distance between a boundary of the orthographic projection of the light shielding portion 310 on the base plate 100 and a boundary of the orthographic projection of the isolation portion 210 on the base plate 100 is less than or equal to 10 μm.

In these optional embodiments, under a condition that the distance between the boundary of the orthographic projection of the light shielding portion 310 on the base plate 100 and the boundary of the orthographic projection of the isolation portion 210 on the base plate 100 is less than or equal to 10 μm, the problem that the light-emitting efficiency of the light-emitting unit 230 is affected due to the size of the light shielding portion 310 being exceedingly great can be improved, and the problem that great-angle light emitted by the light-emitting unit 230 can hardly be shielded due to the size of the light shielding portion 310 being exceedingly small can be improved.

Under a condition that the area of the orthographic projection of the auxiliary portion 320 on the base plate 100 is less than the area of the orthographic projection of the isolation portion 210 on the base plate 100, the light-emitting unit 230 can be arranged in various manners, and the light-emitting unit 230 can only be located in the pixel opening 220, or at least a part of the light-emitting unit 230 can also extend from the pixel opening 220 to a surface of the isolation portion 210 away from the base plate 100 and be located in a space enclosed by the auxiliary portion 320.

Under a condition that the light-emitting unit 230 is only located in the pixel opening 220, the light shielding portion 310 may extend to an area where the pixel opening 220 is located to shield at least a part of the light-emitting unit 230. Under a condition that the at least a part of the light-emitting unit 230 extends from the pixel opening 220 to the surface of the isolation portion 210 away from the base plate 100 and is located in the space enclosed by the auxiliary portion 320, the light shielding portion 310 may extend to the area where the pixel opening 220 is located, or the light shielding portion 310 may only extend to a part of an area where a light-emitting unit 230 located on the isolation portion 210 is located, as long as the light shielding portion 310 can shield great-angle light emitted by the light-emitting unit 230, i.e., the orthographic projection of the light shielding portion 310 on the base plate 100 at least partially covers the orthographic projection of the light-emitting unit 230 on the base plate 100.

As above, the light shielding portion 310 may shield a light-emitting unit 230 located in the area where the pixel opening 220 is located, and then the orthographic projection of the light shielding portion 310 on the base plate 100 may be greater than or equal to the orthographic projection of the isolation portion 210 on the base plate 100. Alternatively, the light shielding portion 310 may also shield a part of a light-emitting unit 230 located on the surface of the isolation portion 210 away from the base plate 100, and then the orthographic projection of the isolation portion 210 on the base plate 100 may be greater than or equal to the orthographic projection of the light shielding portion 310 on the base plate 100.

The base plate 100 can be arranged in various manners, such as an array substrate, and the base plate 100 includes a substrate and a driving circuit arranged on the substrate. The substrate may be a rigid substrate or a flexible substrate. Optionally, a pixel electrode layer is further provided between the array substrate and the pixel definition layer 200, the pixel electrode layer includes pixel electrodes 110 distributed in an array and corresponding to the light-emitting units 230, and the pixel electrodes 110 are connected with the driving circuit and are configured to drive the light-emitting units 230 to emit light.

The pixel definition layer 200 can be arranged in various manners, and the pixel definition layer 200 can be made of a transparent organic material. For example, a material of the pixel definition layer 200 may be hexamethyldisiloxane, epoxy resin, or Polyimide (PI), and may also be silicon-based glue materials having a light transmittance above 90%, or other organic glue materials having a slightly lower light transmittance (above 80%) but a slightly higher bending strength, which is not limited in the present embodiment.

The light shielding portion 310 can be arranged in various manners. In order to achieve the light-shielding effect, a material of the light shielding portion 310 may be selected from a light-reflecting material or a light-absorbing material. For example, a light-reflecting material is selected as the material of the light shielding portion 310, and then the material of the light shielding portion 310 can include a light-reflecting material such as metal, so that the light shielding portion 310 can not only shield the great-angle light emitted by the light-emitting unit 230, but also reflect these light back into the light-emitting unit 230, which improves the light-emitting efficiency of the light-emitting unit 230, so as to improve the display effect of the display panel. Alternatively, the material of the light shielding portion 310 includes a light-absorbing material. For example, the material of the light shielding portion 310 includes a black insulating light-absorbing material, so that the light shielding portion 310 can absorb the great-angle light emitted by the light-emitting unit 230, so as to reduce light mixing and improve the display effect of the display panel.

In some optional embodiments, as shown in FIGS. 1 and 2, the display panel further includes a first electrode 410 located at a side of the light-emitting unit 230 away from the base plate 100, a material of the auxiliary portion 320 includes an conductive material, and the first electrode 410 corresponding to two adjacent light-emitting units 230 of at least a part of light-emitting units 230 are electrically connected with each other through the auxiliary portion 320.

In these optional embodiments, the auxiliary portion 320 is made of a conductive material, a plurality of first electrodes 410 can be interconnected as a surface electrode through auxiliary portion 320, and the first electrode 410 can cooperate with the pixel electrode 110 to drive the light-emitting unit 230 to emit light.

Alternatively, since the first electrodes 410 are connected with each other through the auxiliary portions 320, the first electrodes 410 may be arranged corresponding to the light-emitting units 230, i.e., the first electrodes 410 and the light-emitting units 230 are arranged in a one-to-one correspondence, so that the first electrode 410 does not need to cross the auxiliary portion 320 and the isolation portion 210, and a single first electrode 410 does not easily break due to a small size thereof. Therefore, a thickness of the first electrode 410 can be thinner, so that a light transmittance of the first electrode 410 can be increased, and a light-emitting rate of the light-emitting unit 230 can be increased, so as to improve the display effect of the display panel. In addition, since the auxiliary portion 320 has a conductive property, and the auxiliary portion 320 is connected with the first electrode 410, a resistance of the first electrode 410 can be reduced, which solves the problem of uneven display of the display panel due to an exceedingly great resistance of the first electrode 410.

Optionally, the first electrode 410 is located in the pixel opening 220, or the first electrode 410 is located in the space enclosed by the auxiliary portion 320.

In some optional embodiments, the first electrode 410 is in contact with the auxiliary portion 320 and covers at least a part of an inner wall surface of the auxiliary portion 320 facing the pixel opening 220, so as to increase a contact area between the first electrode 410 and the auxiliary portion 320, reduce a resistance where the first electrode 410 is connected with the auxiliary portion, and increase an amount of a current flowing through between the first electrode 410 and the auxiliary portion 320, i.e., a greater current can flow between the first electrode 410 and the auxiliary portion 320, which improves the display effect of the display panel affected by the exceedingly great resistance and an insufficient amount of a current flowing through.

The first electrode 410 is generally connected with a common ground terminal voltage (ELVSS) signal line, so that the first electrode 410 is at a low-level potential. Under a condition that the first electrode 410 and the auxiliary portion 320 are connected with each other, the first electrode 410 may be connected with the ELVSS signal line through the auxiliary portion 320.

Figure 3:
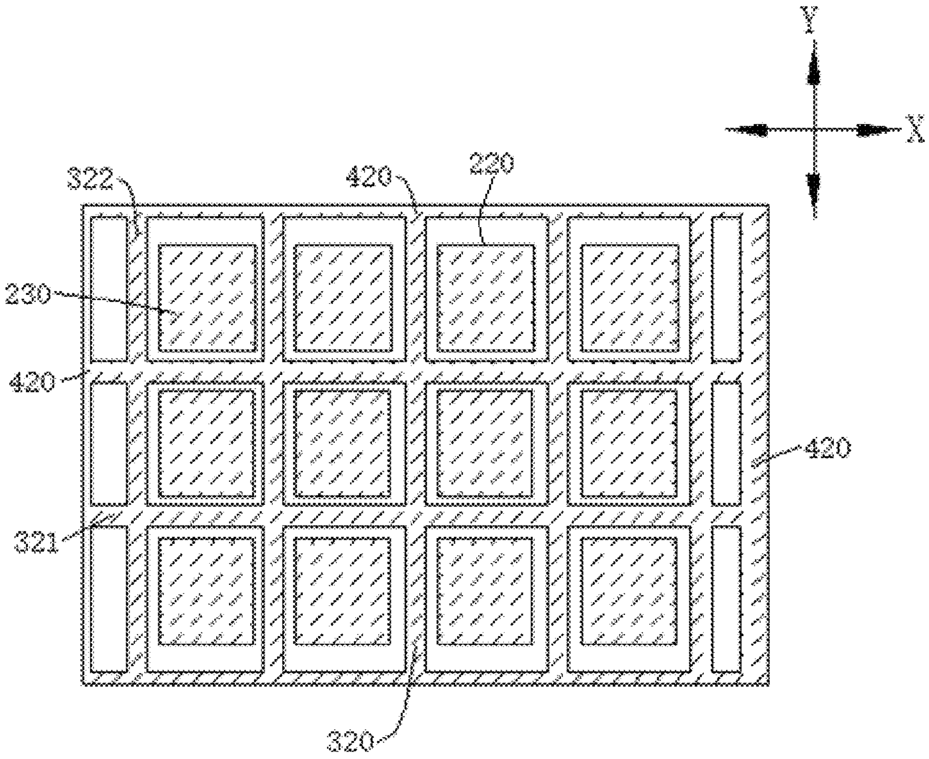
FIG. 3 shows a top schematic diagram of a partial layer structure of a display panel according to an embodiment of the present application.

Referring to FIGS. 2 and 3, FIG. 3 shows a top diagram of a partial layer structure of a display panel according to an embodiment of the present application.

In some optional embodiments, as shown in FIGS. 2 and 3, the display panel further includes a power supply signal line 420, and the auxiliary portion 320 is electrically connected with the power supply signal line 420, so that the first electrode 410 may be electrically connected with the power supply signal line 420 through the auxiliary portion 320. The power supply signal line 420 may be the ELVSS signal line described above.

The auxiliary portion 320 can be arranged in various manners. For example, the orthographic projection of the auxiliary portion 320 on the base plate 100 is in a strip shape, and an end portion of the auxiliary portion 320 is connected with the power supply signal line 420. Alternatively, for example, orthographic projections of the auxiliary portions 320 on the base plate 100 are in a grid shape, and each of ends of a plurality of the auxiliary portions 320 is connected with the power supply signal line 420, to increase a connection area between the auxiliary portion 320 and the power supply signal line 420.

Optionally, the power supply signal line 420 is in a ring shape and is arranged around the auxiliary portion 320 and the plurality of first electrodes 410. For example, the power supply signal line 420 can be located in a frame area of the display panel, the first electrode 410 and the auxiliary portion 320 are located in a display area of the display panel, the frame area is arranged around the display area, and the power supply signal line 420 is arranged around the first electrode 410 and the auxiliary portion 320 in the frame area.

Optionally, as shown in FIG. 3, the auxiliary portions 320 are in a grid shape, the auxiliary portions 320 include a first auxiliary portion 321 extending along a first direction X and a second auxiliary portion 322 extending along a second direction Y. A plurality of first auxiliary portions 321 are arranged in rows along the second direction Y, two ends of each first auxiliary portion 321 in the first direction X are connected with the power supply signal line 420. A plurality of second auxiliary portions 322 are arranged in columns along the first direction X, two ends of each second auxiliary portion 322 in the second direction Y are connected with the power supply signal line 420. Therefore, the contact area between the auxiliary portion 320 and the power supply signal line 420 is further increased, the resistance is reduced, and an area of the current flowing through between the auxiliary portion 320 and the power supply signal line 420 is increased.

Optionally, an orthographic projection of at least a part of the partition column 300 on the base plate 100 may be arranged around an orthographic projection of one pixel opening 220 or a plurality of pixel openings 220 on the base plate 100. For example, only the orthographic projection of the auxiliary portion 320 of the partition column 300 on the base plate 100 may be arranged around the orthographic projection of one pixel opening 220 or a plurality of pixel openings 220 on the base plate 100. In certain embodiments, an orthographic projection of an entirety of the partition column 300 on the base plate 100 may also be arranged around one pixel opening 220 or a plurality of pixel openings 220.

Figure 4:
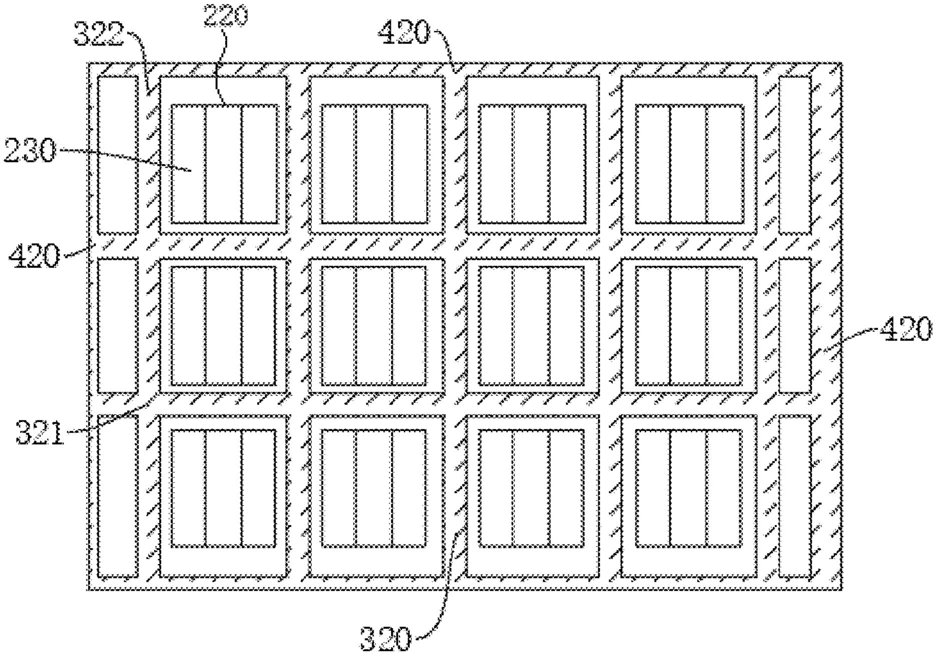
FIG. 4 shows a top schematic diagram of a partial layer structure of a display panel according to another embodiment of the present application.

Optionally, as shown in FIG. 3, the orthographic projection of the auxiliary portion 320 on the base plate 100 may be arranged around an orthographic projection of one pixel opening 220 on the base plate 100, or as shown in FIG. 4, the orthographic projection of the auxiliary portion 320 on the base plate 100 may be arranged around an orthographic projection of a plurality of pixel openings 220 on the base plate 100. Under a condition that the orthographic projection of the auxiliary portion 320 on the base plate 100 is arranged around the orthographic projection of one pixel opening 220 on the base plate 100, the first electrodes 410 and the light-emitting units 230 are arranged in a one-to-one correspondence, and each of the first electrodes 410 corresponding to the light-emitting units 230 can be connected with the auxiliary portion 320. Under a condition that the orthographic projection of the auxiliary portion 320 on the base plate 100 is arranged around the orthographic projection of the plurality of pixel openings 220 on the base plate 100, the first electrodes 410 may be arranged corresponding to the plurality of light-emitting units 230 as long as the plurality of first electrodes 410 can be connected to each other through the auxiliary portion 320.

Under a condition that the orthographic projection of the isolation portion 210 on the base plate 100 is greater than or equal to the orthographic projection of the light shielding portion 310 on the base plate 100, the entirety of the partition column 300 may be arranged around the orthographic projection of a single pixel opening 220 or a plurality of pixel openings 220 on the base plate 100. That is, the orthographic projections of the auxiliary portion 320 and the light shielding portion 310 on the base plate 100 are both arranged around the orthographic projection of a single pixel opening 220 or a plurality of pixel openings 220 on the base plate 100, so that the light shielding portion 310 can shield great-angle light emitted by each light-emitting unit 230.

In some optional embodiments, the plurality of light-emitting units 230 are combined to form a repeating unit, repeating units are sequentially arranged to form a pixel arrangement structure of the display panel, and the orthographic projections of the light shielding portion 310 and the auxiliary portion 320 on the base plate 100 is arranged around an orthographic projection of a pixel opening corresponding to each repeating unit on the base plate 100.

In these optional embodiments, the pixel arrangement structure is formed by sequentially repeating the arrangement of the repeating units. The light shielding portion 310 and the auxiliary portion 320 are arranged around the pixel opening corresponding to each repeating unit, so that light mixing between two adjacent repeating units can be reduced, so as to improve the display effect of the display panel.

In other embodiments, the plurality of light-emitting units 230 are combined to form a display unit, and the orthographic projections of the light shielding portion 310 and the auxiliary portion on the base plate 100 are arranged around an orthographic projection of a pixel opening corresponding to each display unit on the base plate 100. For example, the display unit is a display unit emitting white light. In these embodiments, the plurality of light-emitting units 230 are combined to form a display unit. For example, a red light-emitting unit, a green light-emitting unit and a blue light-emitting unit are combined to form a display unit for emitting white light. The light shielding portion 310 is arranged around the pixel opening corresponding to each display unit, so that the light shielding portion 310 can reduce light mixing between two adjacent display units, so as to improve the display effect of the display panel.

Optionally, with further reference to FIG. 2, the display panel includes an encapsulation layer 700 for encapsulating the light-emitting unit 230. The encapsulation layer 700 includes a first inorganic layer 71, an organic layer 72, and a second inorganic layer 73 sequentially arranged in a direction away from the light-emitting unit 230.

Optionally, the first inorganic layer 71 includes a plurality of independent encapsulation portions located at a side of light-emitting units 230 away from the base plate 100 and separated by the partition column 300 to be independent of each other. As above, the size of the auxiliary portion 320 is less than the size of the light shielding portion 310, so that the first inorganic layer 71 of the encapsulation layer can break more easily at a position where the partition column 300 is located, and form a plurality of independent encapsulation portions independent of each other, which encapsulate the light-emitting units independently. It is difficult for water and oxygen to spread among the independent encapsulation portions, and performance between adjacent independent encapsulation portions is not affected, which mitigates the problem of water and oxygen diffusion in the first inorganic layer 71 better, and improves the encapsulation performance of the display panel.

Figure 5:
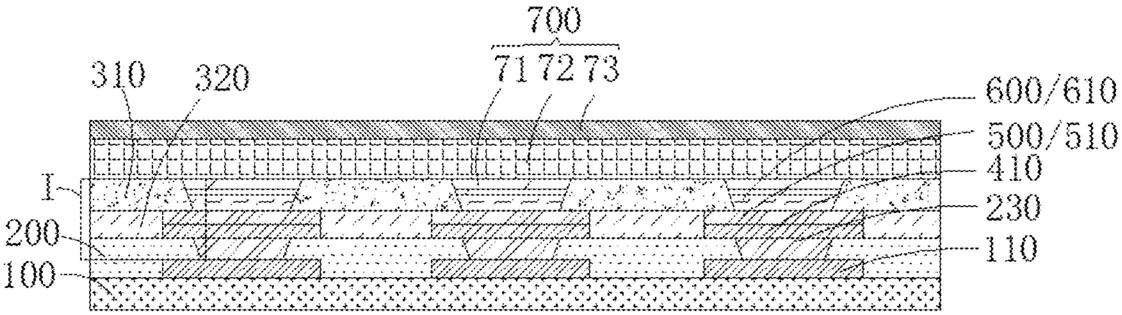
FIG. 5 shows a cross-sectional view at A-A in FIG. 1 in yet another embodiment.

Optionally, as shown in FIG. 5, the display panel further includes a dimming layer 500 and a protective layer 600 stacked in sequence at a side of the light-emitting unit 230 away from the base plate 100, and the dimming layer 500 and the protective layer 600 are located between the encapsulation layer 700 and the first electrode 410.

For example, the dimming layer 500 may be a CPL (cappling layer), which is mainly for purposes of reducing the optical waveguide effect and improving the overall light-emitting performance of the device, and the protective layer 600 may be made of a LiF (lithium fluoride) material, which plays a role of protecting the CPL layer.

Optionally, in the thickness direction Z of the display panel, thicknesses of at least one of dimming layers 500, protective layers 600 and first inorganic layers 71 corresponding to the light-emitting units 230 of different colors are different. Due to the existence of the partition column 300, some film layers over each light-emitting unit 230 can be partitioned into parts independent of each other by the partition column 300, and therefore thicknesses of some film layers over each light-emitting unit 230 can be adjusted according to actual needs. For example, film layer thicknesses of any one of the dimming layer 500, the protective layer 600 and the first inorganic layer 71 corresponding to each light-emitting unit 230 can be adjusted according to actual needs.

For example, the dimming layer 500 includes a dimming portion 510 located between the light-emitting unit 230 and the independent encapsulation portion. A plurality of dimming portions 510 are separated by the partition columns 300 and arranged to be independent of each other, and thicknesses of dimming portions 510 corresponding to the light-emitting units 230 of different colors are different. By adjusting a thickness of the dimming portion 510 according to a color of the light-emitting unit 230, the problem of uneven display can be mitigated. Optionally, adjacent dimming portions 510 may also be separated by the auxiliary portion 320.

Optionally, the protective layer 600 includes a protective portion 610 located between the light-emitting unit 230 and the independent encapsulation portion, i.e., a plurality of protective portions 610 are separated by the partition columns 300 and arranged to be independent of each other, and thicknesses of protection portions 610 corresponding to the light-emitting units 230 of different colors are different. By adjusting a thickness of the protective portion 610 according to the color of the light-emitting unit 230, the problem of uneven display can be mitigated. Optionally, adjacent protective portions 610 may also be separated by the auxiliary portion 320.

Figure 6:
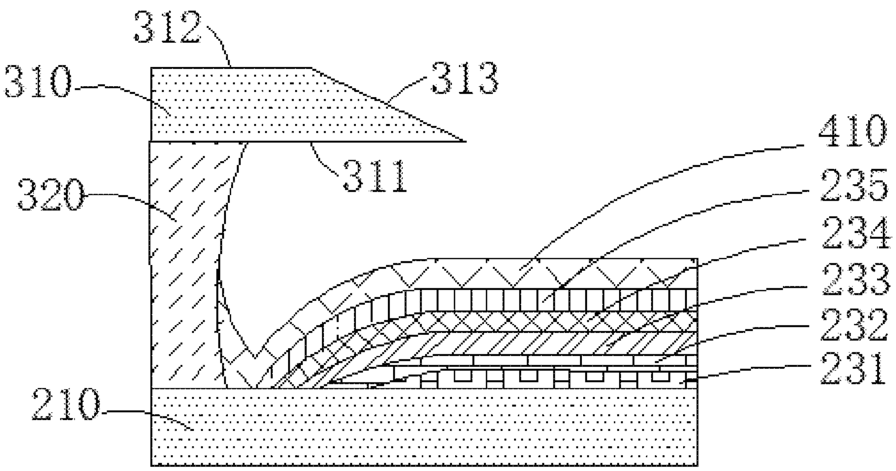
FIG. 6 shows a partial enlarged schematic structural diagram at I in FIG. 5.

Referring to FIGS. 1, 5 and 6, FIG. 5 shows a cross-sectional view at A-A of FIG. 1 in yet another embodiment, and FIG. 6 shows a partial enlarged schematic structural diagram at I in FIG. 5.

In some optional embodiments, as shown in FIGS. 1, 5, and 6, the light-emitting unit 230 includes a hole injection layer 231, a hole transport layer 232, a light-emitting material layer 233, an electron transport layer 234, and an electron injection layer 235 stacked in sequence in a direction away from the base plate 100, and each of the hole injection layer 231, the hole transport layer 232, the light-emitting material layer 233, the electron transport layer 234, and the electron injection layer 235 is spaced apart from the auxiliary portion 320.

In these optional embodiments, each of the hole injection layer 231, the hole transport layer 232, the light-emitting material layer 233, the electron transport layer 234, and the electron injection layer 235 in the light-emitting unit 230 is spaced apart from the auxiliary portion 320, so that the problem of cross-talk between carriers in the light-emitting unit 230 through the auxiliary portion 320 can be mitigated, and the problem of light mixing between two adjacent light-emitting units 230 can be further mitigated.

Optionally, in at least two adjacent ones of the hole injection layer 231, the hole transport layer 232, the light-emitting material layer 233, the electron transport layer 234, and the electron injection layer 235, a distance from one close to the base plate 100 to a corresponding adjacent auxiliary portion 320 is greater than a distance from another one away from the base plate 100 to the corresponding adjacent auxiliary portion 320.

For example, distances from the hole injection layer 231, the hole transport layer 232, the light-emitting material layer 233, the electron transport layer 234, and the electron injection layer 235 to the auxiliary portion 320 gradually decrease.

In order to prevent the hole injection layer 231, the hole transport layer 232, the light-emitting material layer 233, the electron transport layer 234, the electron injection layer 235 from being electrically connected with the auxiliary portion 320, distances between the hole injection layer 231, the hole transport layer 232, the light-emitting material layer 233, the electron transport layer 234, and the electron injection layer 235, and the auxiliary portion 320 may be increased, i.e., the first electrode 410 is electrically connected with the auxiliary portion 320, and a distance between the first electrode 410 and the auxiliary portion 320 is the least. Each of the hole injection layer 231, the hole transport layer 232, the light-emitting material layer 233, the electron transport layer 234, and the electron injection layer 235 is spaced apart from the auxiliary portion 320 by a certain distance, which results in a spacing. In addition, since the hole injection layer 231, the hole transport layer 232, the light-emitting material layer 233, the electron transport layer 234, and the electron injection layer 235, as well as the first electrode 410 are arranged in a layer-by-layer covering manner, an upper film layer can also be used to cover and block a lower film layer by limiting a distance from each film layer to the adjacent auxiliary portion 320, to further cut off a path that may cause the lateral conduction and improve the display effect.

Optionally, a distance from a latter one of the hole injection layer 231, the hole transport layer 232, the light-emitting material layer 233, the electron transport layer 234, and the electron injection layer 235, as well as the first electrode 410 to a corresponding adjacent auxiliary portion 320 may be less than or equal to a distance from a former one to a corresponding adjacent auxiliary portion 320. For example, a distance from the hole transport layer 232 to a corresponding adjacent auxiliary portion 320 may be equal to a distance from the hole injection layer 231 to a corresponding adjacent auxiliary portion 320, or may be less than the distance from the hole injection layer 231 to a corresponding adjacent auxiliary portion 320, which is not limited particularly.

Figure 7:
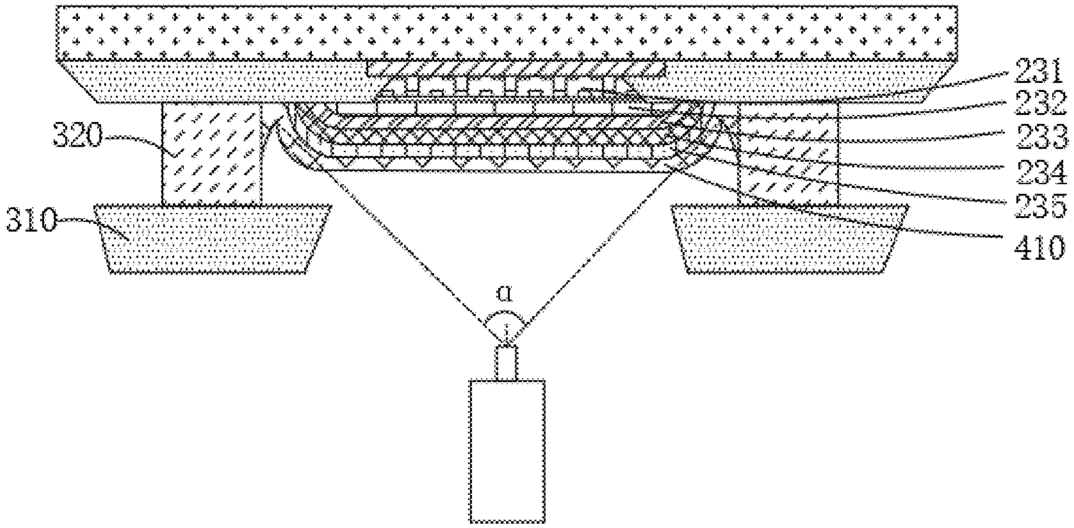
FIG. 7 shows a schematic structural diagram of a display panel in a process of manufacturing according to an embodiment of the present application.

Referring to FIG. 7, in order to implement the above-described film layer stack structure, it is specifically possible to adjust the coverage of the evaporation material by adjusting an evaporation angle $\alpha$ of each film layer during evaporation, so as to control the distances from the hole injection layer 231, the hole transport layer 232, the light-emitting material layer 233, the electron transport layer 234, and the electron injection layer 235, as well as the first electrode 410 to a corresponding adjacent auxiliary portion.

In some optional embodiments, the light-emitting units 230 emit light of different colors, the light-emitting units 230 are used for implementing colorized display of the display panel, and thicknesses of first electrodes 410 corresponding to light-emitting units 230 of different colors are different. A first electrode 410 corresponding to the light-emitting unit 230 is a first electrode 410 located at the side of the light-emitting unit 230 away from the base plate 100.

Since the first electrodes 410 in an embodiment of the present application has been separated by the partition columns 300 individually, film layers of the first electrodes 410 can be formed individually, i.e., a thickness of each first electrode 410 can be adjusted according to actual needs. By adjusting the thickness of the first electrode 410, the monochrome efficiency and a variation trend of the brightness attenuation of the light-emitting unit 230 can be adjusted, so that a thickness of a first electrode 410 of each of the light-emitting units 230 of different colors can be adjusted in a targeted manner to change the light-emitting effect of each light-emitting unit 230, so as to reduce a viewing angle color difference of the display panel and improve the display effect.

Optionally, the light-emitting units 230 of different colors include a red light-emitting unit, a green light-emitting unit and a blue light-emitting unit, and a thickness of the first electrode 410 corresponding to the red light-emitting unit and a thickness of the first electrode 410 corresponding to the blue light-emitting unit are both greater than a thickness of the first electrode 410 corresponding to the green light-emitting unit.

The thickness of the first electrode 410 corresponding to the red light-emitting unit is set to be relatively great, which can effectively increase the light-emitting efficiency of the red light-emitting unit. The blue light-emitting unit is limited by a material the light-emitting material layer 233 is made of and has a relatively short service life, and thus the thickness of the first electrode 410 corresponding to the blue light-emitting unit is set to be relatively great, which can effectively increase the service life of the blue light-emitting unit. Red light, green light and blue light emitted by the red light-emitting unit, the green light-emitting unit and the blue light-emitting unit are mixed with each other to form white light, and a proportion of the green light in the formed white light is the greatest. By setting the thickness of the first electrode 410 corresponding to the green light-emitting unit to be less than the thickness of the first electrode 410 corresponding to the red light-emitting unit and the thickness of the first electrode 410 corresponding to the blue light-emitting unit, a brightness attenuation amplitude of the green light at a side view can be reduced, so as to ensure the brightness of the white light.

Optionally, the thickness of the first electrode 410 corresponding to the red light-emitting unit is 110-180 angstroms, the thickness of the first electrode 410 corresponding to the blue light-emitting unit is 110-180 angstroms, and the thickness of the first electrode 410 corresponding to the green light-emitting unit is 80-150 angstroms. Specifically, the thickness of the first electrode 410 corresponding to the red light-emitting unit can be 125 angstroms, and the thickness of the first electrode 410 corresponding to the blue light-emitting unit is 130 angstroms, and the monochrome efficiency, brightness attenuation and viewing angle color difference of the display panel can be better optimized by setting different cathode thicknesses as described above.

In some optional embodiments, with further reference to FIG. 6, the light shielding portion 310 includes a first surface 311 facing the isolation portion 210 and a second surface 312 away from the isolation portion 210, and an orthographic projection of the second surface 312 on the base plate 100 is located within an orthographic projection of the first surface 311 on the base plate 100. Optionally, an edge of the first surface 311 is located at a side of the second surface 312 facing an adjacent pixel opening 220.

In these optional embodiments, the orthographic projection of the second surface 312 on the base plate 100 is located within the orthographic projection of the first surface 311 on the base plate 100, and thus a side surface 313 connecting the first surface 311 and the second surface 312 can be inclined. During the evaporation of the lighting unit 230, the inclined side surface 313 can carry excess evaporation material. In comparison with the prior art, the side surface 313 being inclined with respect to extending vertically in the thickness direction Z can prevent excessive accumulation of evaporation material on a vertical side surface 313 from falling down onto the underlying light-emitting unit 230, prevent from forming foreign objects on the light-emitting unit 230, and improve the manufacturing yield rate of the display panel.

Optionally, as described above, the light shielding portion 310 further includes a side surface 313 connecting the first surface 311 and the second surface 312, and the side surface 313 is planar and inclined close to the first surface 311 in a direction close to the pixel opening 220. The side surface 313 is planar. On the one hand, it are easy to manufacture and on the other hand, more evaporation material can be carried.

Optionally, an angle between the side surface 313 and the first surface 311 is less than or equal to 45°.

The less the angle between the side surface 313 and the first surface 311, the slower a slope of the side surface 313, and the evaporation material carried by the side surface 313 less likely to fall down, so that the manufacturing yield rate of the display panel can be better increased. Therefore, under a condition that the angle between the side surface 313 and the first surface 311 is less than or equal to 45°, more evaporation material can be carried on the side surface 313, and the evaporation material cannot easily fall from the side surface 313 onto the light-emitting unit 230, so that the manufacturing yield rate of the display panel can be better increased.

Optionally, along a thickness direction Z of the display panel, a cross-section of the light shielding portion 310 is in a trapezoid shape, and the side surface 313 is a waist of the trapezoid shape. Optionally, along the thickness direction Z, the light shielding portion 310 is in a isosceles trapezoid shape. Therefore, the shielding effects of the light shielding portion 310 on pixel openings 220 located at both sides thereof tends to be consistent, and the display effects at different positions of the display panel are more uniform.

As above, the display panel includes an encapsulation layer 700 for encapsulating the light-emitting unit 230. With further reference to FIG. 2, a color film base plate 800 may be arranged at a side of the encapsulation layer 700 away from the light-emitting unit 230, the color film base plate 800 includes at least one blocking portion 810 and at least one light-filtering opening 820 enclosed by the blocking portion 810, a light-filtering unit 830 is provided in the light-filtering opening 820, and an orthographic projection of each light-filtering unit 830 on the base plate 100 at least partially overlaps an orthographic projection of each light-emitting unit on the base plate.

In these optional embodiments, by arranging the color film substrate 800 in the display panel, stray light can be filtered through the filter unit 830 of the color film base plate 800, to improve the display effect of the display panel. In addition, under a condition that the color film base plate 800 is arranged in the display panel, a polarizer is not required, which can simplify a structure of the display panel.

Optionally, and with further reference to FIG. 2, the display panel further includes a touch layer 900 located between the color film base plate 800 and the encapsulation layer 700.

As above, the light-emitting unit 230 may be used to realize the colorized display of the display panel.

In other embodiments, the plurality of light-emitting units 230 emit light of a same color, and the light-emitting units 230 are used as a light source of the display panel. For example, a quantum dot material unit is further arranged on the light-emitting unit 230, and the quantum dot material unit is used for converting light emitted by the light-emitting unit 230 into light of a designated color, so as to realize the colorized display of the display panel. At this time, the light-emitting unit 230 may be an organic light-emitting diode, or the light-emitting unit 230 may also be a micro light-emitting diode.

Embodiments of the second aspect of the present application provide a display apparatus including the display panel according to any of the embodiments of the first aspect. Since the display apparatus according to the embodiments of the second aspect of the present application includes the display panel according to any of the embodiments of the first aspect, the display apparatus according to the embodiments of the second aspect of the present application has the beneficial effects of the display panel according to any of the embodiments of the first aspect, which is not repeated herein.

The display apparatus according to the embodiments of the present application includes, but is not limited to a mobile phone, a personal digital assistant (PDA), a tablet computer, an e-book, a television, an entrance guard, a smart fixed phone, a console and other devices with a display function.

The above embodiments of the present application do not exhaustively describe all the details, nor do they limit the present application to the specific embodiments as described. Obviously, according to the above description, many modifications and changes can be made. These embodiments are selected and particularly described in the specification to better explain the principles and practical applications of the present application, so that a person skilled in the art is able to utilize the present application and make modifications based on the present application. The present application is limited only by the claims and the full scope and equivalents of the claims.

What is claimed is:

1. A display panel, comprising:

a base plate;

a pixel definition layer located on the base plate, the pixel definition layer comprising at least one isolation portion and a pixel opening enclosed by the isolation portion, a plurality of light-emitting units provided in the pixel opening;

a partition column comprising an auxiliary portion and a light shielding portion stacked in sequence at a side of the isolation portion away from the base plate, wherein an orthographic projection of the auxiliary portion on the base plate is located within an orthographic projection of the light shielding portion on the base plate, and an encapsulation layer, for encapsulating the plurality of light-emitting units, wherein:

the encapsulation layer comprises a first inorganic layer, the first inorganic layer comprises a plurality of independent encapsulation portions located at a side of the plurality of light-emitting units away from the base plate and separated by the partition column to be independent of each other, and thicknesses of the plurality of independent encapsulation portions corresponding to light-emitting units of different colors are different;

a color film base plate located at a side of the encapsulation layer away from the light-emitting unit, the color film base plate comprises at least one blocking portion and at least one light-filtering opening enclosed by the blocking portion, a light-filtering unit is provided in the light-filtering opening, and an orthographic projection of the light-filtering unit on the base plate at least partially overlaps an orthographic projection of a corresponding light-emitting unit on the base plate.

2. The display panel according to claim 1, further comprising:

a first electrode located at a side of the light-emitting unit away from the base plate, wherein a material of the auxiliary portion comprises a conductive material, and the first electrode corresponding to two adjacent light-emitting units of at least a part of light-emitting units are electrically connected with each other through the auxiliary portion;

wherein the first electrode is in contact with the auxiliary portion and covers at least a part of an inner wall surface of the auxiliary portion facing the pixel opening.

3. The display panel according to claim 2, wherein the display panel further comprises a power supply signal line, and the auxiliary portion is electrically connected with the power supply signal line;

the auxiliary portion is in a strip shape, and an end portion of the auxiliary portion is connected with the power supply signal line.

4. The display panel according to claim 2, wherein an area of the orthographic projection of the auxiliary portion on the base plate is less than an area of an orthographic projection of the isolation portion on the base plate.

5. The display panel according to claim 2, wherein the orthographic projection of the light shielding portion on the base plate at least partially covers an orthographic projection of the light-emitting unit on the base plate.

6. The display panel according to claim 2, wherein the light-emitting unit comprises a hole injection layer, a hole transport layer, a light-emitting material layer, an electron transport layer, and an electron injection layer stacked in sequence in a direction away from the base plate, and each of the hole injection layer, the hole transport layer, the electron transport layer, and the electron injection layer is spaced apart from the auxiliary portion.

7. The display panel according to claim 6, wherein in at least two of the hole injection layer, the hole transport layer, the light-emitting material layer, the electron transport layer, and the electron injection layer, a distance from one close to the base plate to a corresponding adjacent auxiliary portion is greater than a distance from another one away from the base plate to the corresponding adjacent auxiliary portion.

8. The display panel according to claim 2, wherein the plurality of light-emitting units emit light of different colors, and thicknesses of first electrodes corresponding to at least two of the light-emitting units of different colors are different.

9. The display panel according to claim 8, wherein the light-emitting units of different colors comprise a red light-emitting unit, a green light-emitting unit, and a blue light-emitting unit, and a thickness of the first electrode corresponding to the red light-emitting unit and a thickness of the first electrode corresponding to the blue light-emitting unit are both greater than a thickness of the first electrode corresponding to the green light-emitting unit.

10. The display panel according to claim 1, wherein the display panel further comprises:

a dimming portion located between the plurality of light-emitting units and the independent encapsulation portion, and thicknesses of dimming portions corresponding to the light-emitting units of different colors are different.

11. The display panel according to claim 1, wherein the display panel further comprises:

a plurality of protection portions located between the plurality of light-emitting units and the independent encapsulation portion, and thicknesses of the plurality of protection portions corresponding to the light-emitting units of different colors are different.

12. The display panel according to claim 1, wherein the light shielding portion comprises a first surface facing the isolation portion and a second surface away from the isolation portion, and an orthographic projection of the second surface on the base plate is located within an orthographic projection of the first surface on the base plate.

13. The display panel according to claim 12, wherein the light shielding portion further comprises a side surface connecting the first surface and the second surface, and the side surface is planar; and an angle between the side surface and the first surface is less than or equal to 45°.

14. The display panel according to claim 12, wherein along a thickness direction of the display panel, a cross-section of the light shielding portion is in a trapezoid shape.

15. The display panel according to claim 1, wherein orthographic projections of at least a part of the partition column on the base plate is arranged around an orthographic projection of a single pixel opening or orthographic projections of a plurality of the pixel openings on the base plate.

16. The display panel according to claim 1, wherein a material of the light shielding portion comprises a reflective material or a light-absorbing material.

17. The display panel according to claim 1, wherein the plurality of the light-emitting units emit light of a same color, and the light-emitting units are used as a light source of the display panel.

18. A display panel, comprising:

a base plate;

a pixel definition layer located on the base plate, the pixel definition layer comprising at least one isolation portion and a pixel opening enclosed by the isolation portion, at least one light-emitting unit provided in the pixel opening;

a partition column comprising an auxiliary portion and a light shielding portion stacked in sequence at a side of the isolation portion away from the base plate, wherein an orthographic projection of the auxiliary portion on the base plate is located within an orthographic projection of the light shielding portion on the base plate, and an encapsulation layer for encapsulating the at least one light-emitting unit, the encapsulation layer comprising a first inorganic layer located at a side of the at least one light-emitting unit away from the base plate, wherein thicknesses of different parts of the first inorganic layer corresponding to the at least one light-emitting unit of different colors are different;

a color film base plate located at a side of the encapsulation layer away from the light-emitting unit, the color film base plate comprises at least one blocking portion and at least one light-filtering opening enclosed by the blocking portion, a light-filtering unit is provided in the light-filtering opening, and an orthographic projection of the light-filtering unit on the base plate at least partially overlaps an orthographic projection of a corresponding light-emitting unit on the base plate.

* * * * *